United States Patent [19]

Lindmayer

[11] E Re. 28,610

[45] Reissued Nov. 11, 1975

[54] FINE GEOMETRY SOLAR CELL

[75] Inventor: Joseph Lindmayer, Bethesda, Md.

[73] Assignee: Communications Satellite Corporation, Washington, D.C.

[22] Filed: Nov. 19, 1974

[21] Appl. No.: 525,121

Related U.S. Patent Documents

Reissue of:

[64] Patent No.: 3,811,954
Issued: May 21, 1974
Appl. No.: 184,393
Filed: Sept. 28, 1971

[52] U.S. Cl. ..... 136/89; 29/572
[51] Int. Cl.[2] ..... H01L 31/02; H01L 31/04
[58] Field of Search ..... 136/89, 572

[56] References Cited

UNITED STATES PATENTS

| | | | |
|---|---|---|---|
| 2,794,846 | 6/1957 | Fuller | 136/89 |
| 3,164,795 | 1/1965 | Luebbe | 136/89 X |
| 3,361,594 | 1/1968 | Iles et al. | 136/89 |
| 3,411,952 | 11/1968 | Ross et al. | 136/89 |
| 3,472,698 | 10/1969 | Mandelkorn | 136/89 |
| 3,493,822 | 2/1970 | Iles | 136/89 X |
| 3,565,686 | 2/1971 | Babcock | 136/89 X |
| 3,589,946 | 6/1971 | Tarneja et al. | 136/89 |

OTHER PUBLICATIONS

M. Wolf Proceedings of the IRE July 1960 pp. 1246, 1,254–1,266.

Technical Report AFAPL-TR-65-8 2/1965 "Research on Thin Film Polycrepballire Solar Cells" by Aldrich et al. FF, 125 126 pp. 129, 133

*Primary Examiner*—Allen B. Curtis
*Attorney, Agent, or Firm*—Sughrue, Rothwell, Mion, Zinn & Macpeak

[57] ABSTRACT

A fine geometry solar cell having a top surface contact comprising substantially more and finer metallic fingers spaced close together for collecting photocurrent. Junction depth and/or impurity concentration may be reduced significantly. The method for making the fine geometry solar cell, comprises in ordered steps, the processes of diffusion, oxidation, photolithography, metallization and plating.

18 Claims, 4 Drawing Figures

STANDARD GEOMETRY (6 FINGERS)

FINE GEOMETRY (60 LINES)

FINE GEOMETRY SOLAR CELL

Matter enclosed in heavy brackets [ ] appears in the original patent but forms no part of this reissue specification; matter printed in italics indicates the additions made by reissue.

BACKGROUND OF THE INVENTION

This invention relates to solar cells, and more particularly, to a fine geometry solar wherein the surface through which light enters comprises a substantial number of very fine metallic lines (or pattern) which collect current.

The use of photovoltaic devices, commonly known as solar cells, which convert light energy to useful electrical energy is well known. Light entering these solar cells is absorbed, thereby generating electron-hole pairs which are then spacially separated by the electric field produced by the solar cell junction and are collected at respective top and bottom surfaces of the solar cell. For example, in an n-p type solar cell electrons will travel to the top surface where they will then be collected by a metallic grid positioned thereon. The metallic grid may typically comprise six metallic fingers separated along the top surface by a relatively large distance and connected to each other by a common bus bar. The electrons will travel either directly to the metallic fingers or approach the top surface between the fingers and then travel along the surface of the solar cell until they can be collected by one of the fingers. Holes, on the other hand, will travel to the bottom surface of the solar cell where they may be collected by a metallic sheet covering the entire bottom surface.

The six-fingered metallic grid is necessary at the top surface of the solar cells in order to enable light to enter the solar cell. However, one problem associated with the six-fingered construction relates to the relatively large separation between the fingers. Electrons which must travel along the surface to the metallic fingers encounter a high surface resistance. Therefore, due to the relatively long distance the electrons must travel before collection, and due to the problem of surface resistance, a series resistance may develop, thereby limiting the efficiency (electrical power output/solar power input) of solar cells by limiting the electrical power output.

The prior art has sought to obviate the above problem by diffusing an impurity into the surface of the solar cell in a higher order concentration, on the average of about $10^{15}$ atoms per square centimeter or higher. Higher order concentration (i.e., heavier diffusion) lowers the surface resistance but introduces other problems. Higher order concentration of impurities is obtained by a process known as "solid solubility diffusion," i.e., the solar cell is allowed to assume as many impurities as it can on the surface, e.g., approaching $10^{21}$ atoms per cubic centimeter. However, in such a solid solubility process there is crystal lattice damage to the solar cell which propagates deep into the solar cell substrate. The efficiency of the solar cell is thereby reduced in two ways. First, the damage to the crystal lattice causes a reduction in the diffusion length or lifetime of minority carriers. This means that holes, for example, in an n-type diffused region will recombine with available electrons before they can be separated by the junction. Secondly, as discussed below, damage to the crystal structure affects the power output of the solar cell (which is basically a diode) by "softening" the current(i)-voltage(v) characteristics of the diode. In addition, the diffusion of such higher order concentration of impurities creates a relatively deep junction of about 4,000 A. This relatively deep junction means that light of relatively short wavelengths (where solar energy peaks) cannot penetrate beyond the junction, but is absorbed in the diffused region (i.e., between the top surface and the junction). Electron-hole pairs generated in the diffused region have a relatively short diffusion length (even if there were no crystal lattice damage) and therefore will largely recombine before separation by the junction.

The present invention has the advantage of improving the efficiency of solar cells in the short wavelength, i.e., blue-violet portion of the spectrum corresponding to 0.3–0.5 microns thereby sharply increasing output power. The present invention also has the advantage of enabling a degree of freedom in the design of solar cells by reducing the junction depth and/or reducing the impurity concentration while improving solar cell efficiency. In addition, the effect of radiation damage to the solar cell is decreased with improvement in efficiency in the short wavelength region. Also, the use of specified metals for the metallic contact of the present invention provides a moisture resistant contact.

An advantage of extremely shallow junctions wherein there is no crystal lattice damage is that diodes become much more ideal. In the simple junction theory or so-called "diffusion theory" the following relation applies:

$$I=I_0(e^{qV/kT}-1)$$

where I is the diode current, $I_0$ is the reverse diode current, V is the applied voltage and kT/q is the thermal voltage. Actual solar cells do not follow this relationship, but rather the following:

$$I=I_0(e^{qV/nkT}-1)$$

where n is a quantity greater than unity. In conventional solar cells, $n \cong 2$ while of course in the ideal case, $n = 1$. This fact "softens" the I-V characteristics of solar cells. As expressed in terms of the fill factor F=actual power to load/short circuit current × open circuit voltage Defined in this fashion, conventional solar cells show an F of about 72 percent. With the extremely shallow diffusion and reduced impurity surface concentration practiced by the present invention as described below, an n value of about 1.1 and F approaching 80 percent may be obtained. These numbers represent an almost ideal junction.

SUMMARY OF THE INVENTION

The invention comprises any type of solar cell, e.g., silicon or gallium arsenide, having a top surface current collector comprising a significantly greater number of fine metallic fingers (or other fine geometric pattern) wherein the physical separation between the fingers and the width of each finger is substantially reduced. The junction depth and/or impurity concentration is reduced in accordance with the degree of freedom provided by the use of the fine geometry cell. The solar cell is made by first introducing impurities into, for example, a silicon slice, and then oxidizing the solar cell. Then, the fine metallic pattern is placed on the top surface of the solar cell using a photolithography technique. Finally, a plating process is used to build up the fingers of the metallic pattern to a proper thickness.

DETAILED DESCRIPTION OF THE DRAWINGS

Figure 1:
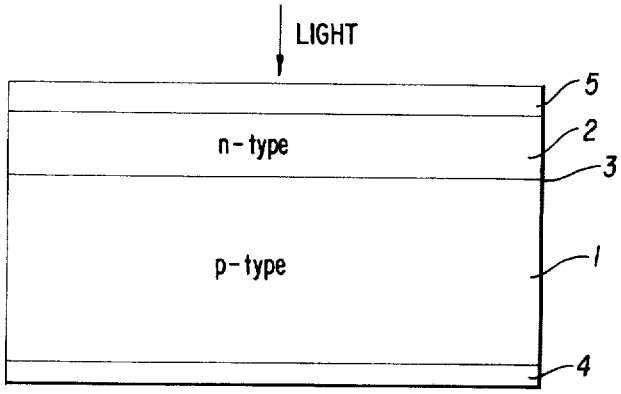
FIG. 1 is a general block diagram of a side view of a solar cell having metallic fingers located on the top surface.

Referring to FIG. 1 there is shown a side view of a typical solar cell. There will be described a single crystal, n-p silicon solar cell though the invention has applicability to all types of single crystal solar cells including, for example, GaAs solar cells. The term "single crystal" is well known in the art and refers to lattices having absolute perfect crystallographic order, but as described herein, also includes nearly single crystal cells which are almost perfectly crystallographic. In addition the inventive concepts are not limited to single crystal solar cells but may be applied to thin film solar cells.

The single crystal silicon solar cell comprises a silicon substrate 1 of p-type material and a silicon layer 2 of n-type material with an n-p junction 3 positioned a predetermined depth below the top surface of silicon layer 2. In an n-p silicon solar cell the junction 3 will produce an electric field directed towards the substrate 1 thereby resulting in generated electrons flowing to the top of surface 2 with holes flowing to the bottom of substrate 1 wherein the holes may be collected by a contact 4 covering the entire back of the bottom surface of layer 1.

Figure 2:
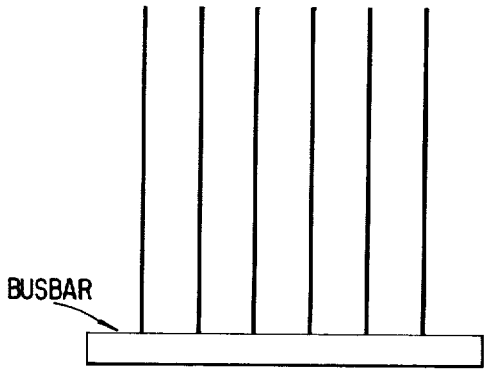
FIG. 2 is a diagram on the standard geometry six-fingered contact used on the top surface of the solar cell of FIG. 1.
Figure 3:
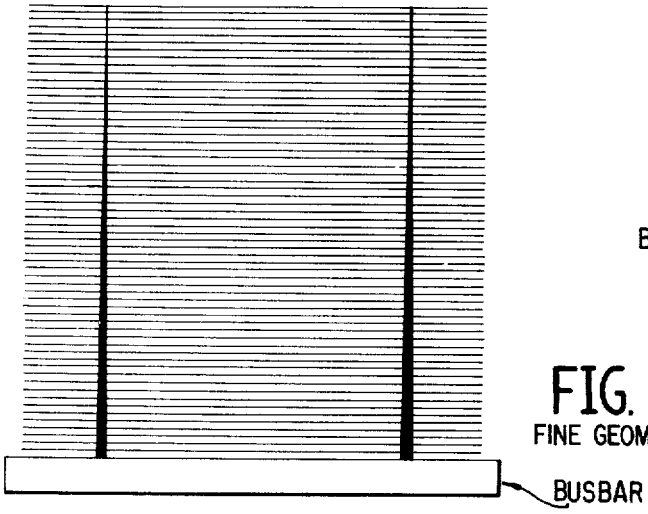
FIG. 3 is a diagram of the fine geometry metallic contact of the present invention used on the top surface of the solar cell of FIG. 1.

The metallic grid pattern 5 used for collection of the electrons flowing to the surface through which light enters is positioned on top of silicon layer 2. In the prior art solar cells the grid pattern 5 may comprise a six-fingered metallic contact of a type shown in FIG. 2. For a solar cell having dimensions 2 × 2 cm. each metallic finger is approximately 0.30 centimeters apart with each finger having a width of about 300 microns. The entire metallic grid would block between 8–10 percent of the light falling on the solar cell. The metallic grid of the present invention, however, as seen in FIG. 3, comprises for a 2 × 2 cm solar cell approximately 60 metallic fingers wherein the separation between each finger is approximately 0.03 centimeters with each metallic finger being between 1–20 microns in width. The fine geometry configuration of the present invention would block less than 10 percent of the solar light. The fine metallic fingers may lie parallel to the main busbar and be connected thereto by tapered, intermediate buses as shown in FIG. 3, or alternately the fine metallic fingers may all lie perpendicular to the main busbar and be directly connected thereto, in the manner shown in FIG. 2.

With the fine geometry solar cell it is now possible to lower the impurity concentration and/or decrease junction depth. If the junction depth is decreased (e.g., by shortening diffusion time and/or lowering diffusion temperature) the efficiency will be improved in three ways. First, more short wavelength light will penetrate beyond the junction 3 to the p-type silicon substrate 1 to generate electron-hole pairs in substrate 1. Electron-hole pairs generated in substrate 1 have a longer lifetime than electron-hole pairs generated in n-type layer 2. Secondly, though all the electrons generated in the solar cell will encounter greater surface resistance at the top of layer 2 with a lowering of surface impurity concentration, the distance along the surface needed to be traveled by the electrons prior to collection will be greatly reduced. In the alternative, if the surface concentration is lowered without decreasing junction depth, the resistance encountered by the electrons will again be offset by the fine geometry contact of FIG. 3. Also, in the latter case, though most of the short wavelength light will generate electron-hole pairs in diffused layer 2, due to a lowering of the impurity concentration in layer 2 the lifetime of holes will be increased.

The manner in which the n-p, silicon solar cell of the present invention having a reduced junction depth is made will now be described. First a p-type silicon piece is cut and polished into a slab, for example, 2 × 2 cm. Then, n-type impurities, e.g., any of the elements from Group VA of the table of elements, such as phosphorus, arsenic or antimony, are diffused into the p-type substrate forming an n-p junction. Whereas the prior art has a diffused junction depth of 4,000 A, the junction depth of the present invention may be as shallow as 1,500 A. To acquire this junction depth of 1,500 A with phosphorus, the phosphorus is diffused into the p-type substrate at about 750 to 825 C for about 5–10 minutes. The diffusion gas having the impurities comprises $O_2$, $N_2$ and $PH_3$ (source of phosphorus), and is fed into the diffusion furnace at a rate of 1,000 cc/min. for $N_2$; 500 cc/min. of 99% Argon, 1% $PH_3$; and 75 cc/min. of $O_2$. The volume concentration of phosphorus in the surface layer would be of the order of magnitude of $10^{19}$ or $10^{20}$ atoms/cubic centimeter. If arsenic or antimony were used then the time and temperature of diffusion would be changed as would be known, to acquire a junction depth of 1,500 A.

After diffusion, the n-p silicon material is exposed to steam for about 2 minutes at 800C. This results in the formation of 1,000 A of $SiO_2$ (glass) extending from the top surface of the n-type material. In the oxidation process approximately several hundred (400–500) A of silicon are removed from the top of the diffused layer which results in several advantages. First, during the diffusion process approximately 450 A of the top surface is damaged which results in a shortening of the lifetime of electrons approaching the surface. Removal of the 400–500 A thereby improves the lifetime of these electrons. Secondly, removal of the 400–500 A of silicon further reduces the junction depth which means more short wavelength light will propagate beyond the junction to generate more carriers therein.

As an additional step in the process of making n-p solar cells of the present invention, all or part of the 1,000 A of the $SiO_2$ may be removed in a conventional manner. Full or partial removal of the $SiO_2$ would be desirable since the glass has an index of refraction of only about 1.46 which means too much light will be reflected from the surface of the solar cell.

The silicon slab is now ready to have the fine geometry pattern placed on the top surface of the diffused layer 2. First, the top surface is coated completely with a photoresist of any known type, e.g., A–Z resist. Then the photoresist is exposed to light or an electron beam through any desired mask having a fine pattern such as the fine geometry pattern of FIG. 3. The method of masking a fine lined mask is well known. The top surface is then developed with any known developer used with the A–Z resist thereby forming the pattern areas (i.e., the fingers) on the bare diffused silicon layer.

Next, using a known vapor deposition technique, about 300 A of chromium is evaporated on the entire top surface followed by the evaporation of 2,000 A of Ag. The photoresist is then dissolved in any known solvent used with the A–Z resist. The solvent "lifts off" the photoresist, and, consequently, the metal on top of the photoresist in areas (between the fingers) where photoresist is in contact with the silicon. This lift off process is knownw as "lift-off photolithography" and results in the fine metallic geometry pattern, i.e., the finger pattern shown in FIG. 3, positioned on the top of the diffused layer 2. Finally, to build up the thickness of each of the metallic fingers to about 20 microns for purposes of good conductivity, silver is plated, in a known manner, onto the metallic fingers.

An alternative photolithography technique for forming the fine geometry pattern would comprise the ordered steps of (1) evaporating a metal, e.g., chromium, over the top surface; (2) covering the metal with photoresist; (3) exposing the photoresist to light or an electron beam through a mask; (4) developing the photoresist; (5) etching off the metal in the area between the fingers (6) using a solvent to dissolve the residual photoresist.

The effect of radiation damage to solar cells is reduced with the fine geometry solar cell of the present invention. Radiation damage to a solar cell affects the response of the cell to longer wavelengths. The present invention, by obtaining more energy output from the short wavelength region than prior art solar cells, has therefore reduced the overall effect of radiation damage.

Figure 4:
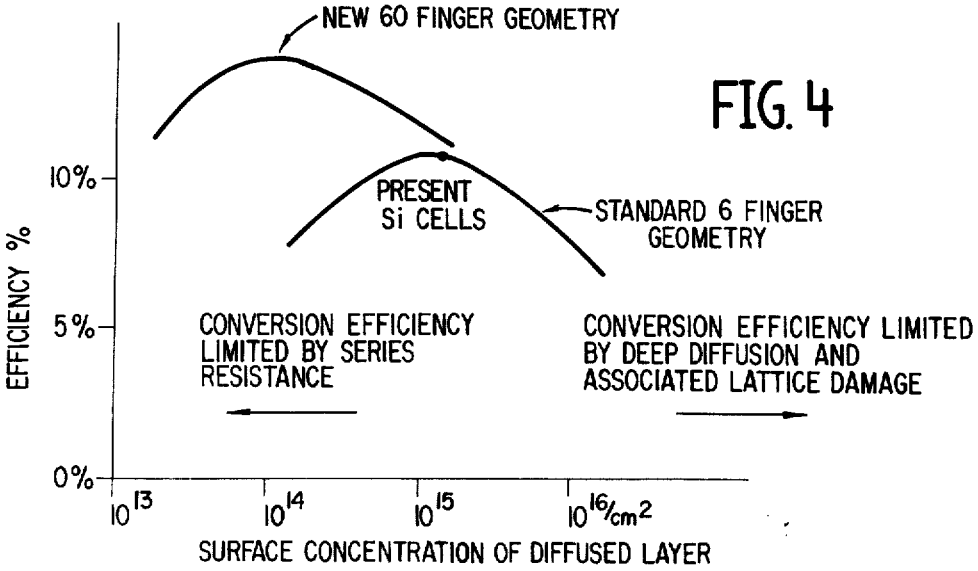
FIG. 4 is a graph of efficiency vs. surface concentration of diffsued layer for a silicon solar cell comparing the prior art six-fingered geometry with the fine geometry of the present invention.

Referring to FIG. 4 there is shown a graph of the efficiency of a solar cell with respect to the surface concentration of diffused layer 2. As can be seen, the efficiency obtainable with the fine geometry solar cell is approximately 50 percent greater than the efficiency obtainable with the standard six finger geometry solar cells.

What is claimed is:

1. A solar cell comprising a semiconductor material having top and bottom surfaces and having a p-n junction at a distance of between 500 A and 2,000 A from the top semiconductor surface thereof, said top surface being adapted to receive incident light radiation, an electrode on said bottom semiconductor surface, and a patterned electrode on said top semiconductor surface, said patterned surface comprising a plurality of thin metallic fingers electrically connected together, said thin metallic fingers being separated by *a* [distances] *distance* [on the order] of $n \times 10^{-2}$ centimeters where n is [a non-zero integer] *any number from one to nine.*

2. A solar cell as claimed in claim 1 wherein said semiconductor material is silicon.

3. A solar cell as claimed in claim 2 wherein said p-n junction is at a depth of approximately 1,500 A and divides said semiconductor material into a top surface layer and a bottom layer.

4. A solar cell as claimed in claim 2 wherein said thin metallic fingers are separated by distances of approximately 0.03 centimeters.

5. A solar cell as claimed in claim 2 wherein said p-n junction divides said semiconductor material into a top n-type layer and a bottom p-type layer.

6. A solar cell as claimed in claim 2 wherein said material between said top surface and said p-n junction has an impurity concentration of about $10^{19} - 10^{20}$ impurity atoms/cm$^3$.

7. A solar cell as claimed in claim 2 wherein said thin metallic fingers are spread substantially evenly over the surface of said solar cell at a density in one dimension of approximately 30 metallic fingers per centimeter.

8. A solar cell as claimed in claim 2 wherein the width of said fingers is between about 1–20 microns.

9. A solar cell as claimed in claim 3 wherein said thin metallic fingers are separated by distances of approximately 0.03 centimeters.

10. A solar cell as claimed in claim 3 wherein said p-n junction divides said semiconductor material into a top n-type layer and a bottom p-type layer.

11. A solar cell as claimed in claim 3 wherein said material between said top surface and said p-n junction has an impurity concentration of about $10^{19} - 10^{20}$ impurity atoms/cm$^3$.

12. A solar cell as claimed in claim 3 wherein said thin metallic fingers are spread substantially evenly over the surface of said solar cell at a density in the dimension of approximately 30 metallic fingers per centimeter.

13. A solar cell as claimed in claim 3 wherein the width of said fingers is between about 1–20 microns.

14. A solar cell as claimed in claim 9 wherein said p-n junction divides said semiconductor material into a top n-type layer and a bottom p-type layer.

15. A solar cell as claimed in claim 14 wherein said material between said top surface and said p-n junction has an impurity concentration of about $10^{19} - 10^{20}$ impurity atoms/cm$^3$.

16. A solar cell as claimed in claim 15 wherein said impurity atoms are atoms selected from a group consisting of phosphorous, arsenic and antimony.

17. A solar cell as claimed in claim 16 wherein said thin metallic fingers are spread substantially evenly over the surface of said solar cell at a density in one dimension of approximately 30 metallic fingers per centimeter.

18. A solar cell as claimed in claim 17 wherein the width of said fingers is between about 1–20 microns.

* * * * *

UNITED STATES PATENT AND TRADEMARK OFFICE

CERTIFICATE OF CORRECTION

PATENT NO. : RE 28,610

DATED : November 11, 1975

INVENTOR(S) : Joseph Lindmayer

It is certified that error appears in the above-identified patent and that said Letters Patent are hereby corrected as shown below:

IN THE SPECIFICATION:

Column 1, line 12 - after "solar", insert -- cell --

Column 3,
line 29 - after "may", insert -- also --

Column 4,
line 32 - delete "750 to 825" and insert -- 750° to 825° --
line 44 - delete "800C" and insert -- 800° C --

Column 5, line 31 - after "fingers", insert a semi-colon

IN THE CLAIMS:

Column 6, line 37 - after "in", delete "the" and insert -- one --

Signed and Sealed this

*twentieth* Day of *April 1976*

[SEAL]

*Attest:*

RUTH C. MASON
*Attesting Officer*

C. MARSHALL DANN
*Commissioner of Patents and Trademarks*